(12) United States Patent
Gupta et al.

(10) Patent No.: US 7,524,743 B2
(45) Date of Patent: Apr. 28, 2009

(54) CONFORMAL DOPING APPARATUS AND METHOD

(75) Inventors: Atul Gupta, Waltham, MA (US); Vikram Singh, North Andover, MA (US); Timothy Miller, South Hamilton, MA (US); Edmund Jacques Winder, Waltham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 397 days.

(21) Appl. No.: 11/163,307

(22) Filed: Oct. 13, 2005

(65) Prior Publication Data

US 2007/0087574 A1  Apr. 19, 2007

(51) Int. Cl.
 *H01L 21/423* (2006.01)
 *H01L 21/425* (2006.01)
(52) U.S. Cl. ............... 438/514; 438/525; 438/563; 250/492.21; 250/492.3
(58) Field of Classification Search .......... 438/514, 438/525, 563; 250/492.21, 492.3
 See application file for complete search history.

(56) References Cited

U.S. PATENT DOCUMENTS

| | | | | |
|---|---|---|---|---|
| 3,751,314 A | * | 8/1973 | Rankel | ............... 438/563 |
| 4,255,615 A | | 3/1981 | Huang et al. | |
| 4,433,247 A | | 2/1984 | Turner | |
| 5,107,202 A | | 4/1992 | Renda | |
| 5,354,381 A | * | 10/1994 | Sheng | ............... 118/723 E |
| 5,497,006 A | | 3/1996 | Sferlazzo et al. | |
| 5,672,541 A | * | 9/1997 | Booske et al. | ............... 438/513 |
| 6,348,373 B1 | * | 2/2002 | Ma et al. | ............... 438/240 |
| 6,410,383 B1 | * | 6/2002 | Ma | ............... 438/247 |
| 6,498,079 B1 | * | 12/2002 | Bryant et al. | ............... 438/542 |
| 2004/0022294 A1 | | 2/2004 | Yamamori et al. | |
| 2005/0205212 A1 | | 9/2005 | Singh et al. | |
| 2006/0236931 A1 | | 10/2006 | Singh et al. | |

FOREIGN PATENT DOCUMENTS

| | | |
|---|---|---|
| JP | 06140191 | 5/1994 |
| WO | 2006014633 A2 | 2/2006 |
| WO | 2007126966 A2 | 11/2007 |

OTHER PUBLICATIONS

Gupta, et al, Conformal Doping Apparatus and Method, U.S. Appl. No. 11/163,303, filed Oct. 13, 2005.
Berger, L.I.: "CRC Handbook of Chemistry and Physics, Dielectric Strength of Insulating Materials"; CRC Handbook of Chemistry and Physics, XX, XX, 2007, pp. 15-42.
Cheung, Nathan W., Plasma Immersion Ion Implantation For ULSI Devices; p. 337; University Of California, Berkeley, CA, USA.
Lee, et al., Plasma Immersion Ion Implantation As An Alternative Deep Trench Buried-Plate Doping Technology, IEEE, 2000, pp. 460-463.
Yu, Crid, et al., Trench Doping Conformality By Plasma Immersion Ion Implantation (PIII), IEEE, 1994, pp. 196-198, University of California, Berkeley, CA, USA.

* cited by examiner

*Primary Examiner*—M. Wilczewski

(57) ABSTRACT

A method of doping includes depositing a layer of dopant material on nonplanar and planar features of a substrate. Inert ions are generated from an inert feed gas. The inert ions are extracted towards the substrate where they physically knock the dopant material into both the planar and nonplanar features of the substrate.

21 Claims, 8 Drawing Sheets

CONFORMAL DOPING APPARATUS AND METHOD

INTRODUCTION

The section headings used herein are for organizational purposes only and should not to be construed as limiting the subject matter described in the present application.

Doping is often achieved using conventional collimated beam-line ion implanters that accelerate ions with an electric field. The accelerated ions are filtered according to their mass-to-charge ratio to select the desired ions for implantation. Doping can also be achieved by using plasma immersion ion implantation (PIII). In PIII, the target is immersed in a plasma containing dopant ions and the target is biased with a series of negative voltage pulses.

The negative bias on the target repels the electrons from the target surface thereby creating a sheath of positive ions. The sheath of positive ions creates an electric field between the sheath boundary and the target surface. The electric field accelerates ions towards the target and implants the ions into the target surface. The sheath boundary conforms to the surface features when the sheath thickness is less than or equal to the dimension of the undulations in the surface that result from ions impacting the surface at a normal angle of incidence relative to the local surface topology. This phenomenon has been utilized for conformally implanting large targets using plasma immersion doping.

Three dimensional device structures are now being developed to increase the available surface area of ULSI circuits as well as to extend the device scaling to sub 65 nm technology nodes. For example, three dimensional trench capacitors used in DRAMs, and numerous types of devices using vertical channel transistors, such as the FinFETs (Double or Triple gate) and recessed channel array transistors (RCAT) are being developed in research laboratories. Many of these three dimensional devices require conformal doping of different features on the devices.

The term "conformal doping" is defined herein as doping of planar and nonplanar surface features in a way that generally preserves the angles of the surface features. In the literature, conformal doping sometimes refers to doping planar and non-planar features with a uniform doping profile over both the planar and nonplanar features. However, conformal doping as defined herein can, but does not necessary, have uniform doping profile over both the planar and nonplanar features of the substrate. In some embodiments of the present invention, conformal doping profiles generally preserve the angles of planar and nonplanar features, but have significant variations in doping over both the planar and nonplanar features of the substrate.

BRIEF DESCRIPTION OF THE DRAWINGS

The aspects of this invention may be better understood by referring to the following description in conjunction with the accompanying drawings, in which like numerals indicate like structural elements and features in various figures. The drawings are not necessarily to scale. The skilled artisan will understand that the drawings, described below, are for illustration purposes only. The drawings are not intended to limit the scope of the present teachings in any way.

DETAILED DESCRIPTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

It should be understood that the individual steps of the methods of the present invention may be performed in any order and/or simultaneously as long as the invention remains operable. Furthermore, it should be understood that the apparatus of the present invention can include any number or all of the described embodiments as long as the invention remains operable.

Some embodiments of the present invention are described in connection with plasma doping. However, the methods and apparatus for conformal doping according to the present are not limited to use with plasma doping systems. One skilled in the art will appreciate that some embodiments of the present invention can be practiced with any type of doping apparatus including beam-line ion implanters.

Figure 1:
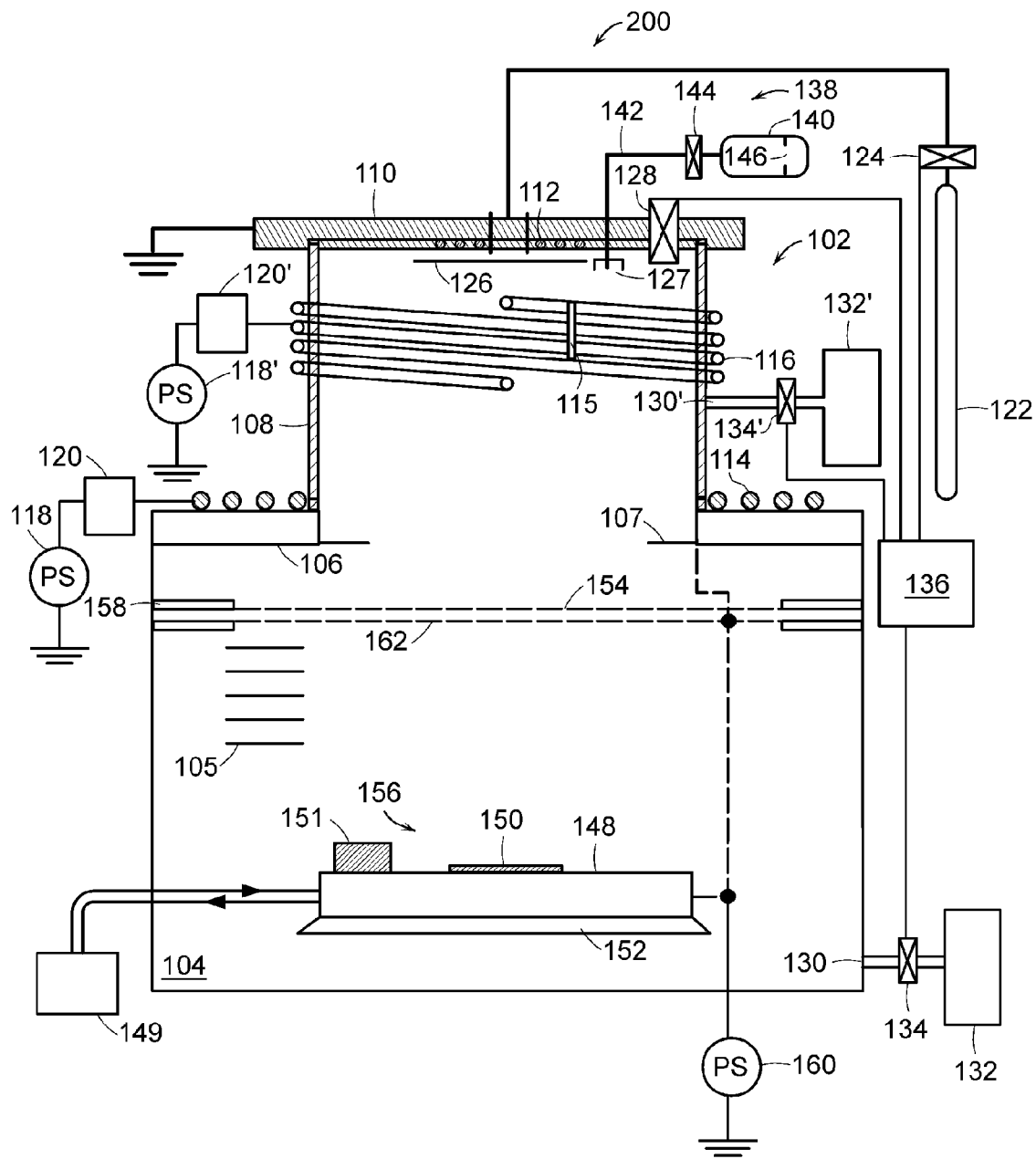
FIG. 1 illustrates one embodiment of a conformal plasma doping apparatus according to the present invention.

FIG. 1 illustrates one embodiment of a conformal plasma doping apparatus 100 according to the present invention. The plasma doping apparatus 100 includes a plasma source 102 that is attached to a process chamber 104. In some embodiments, the process chamber 104 includes at least one gas conductance barrier that increases a pressure proximate to the target or substrate. For example, in some embodiments, the process chamber 104 includes at least one baffle 105.

The plasma source 102 generates dopant ions from a feed gas and then provides dopant ions to the chamber 104. In some embodiments, the plasma source 102 is coupled to the chamber 104 through an aperture 107 having a gas conductance that allows dopant ions to pass into the chamber 104 and that maintains a pressure in the chamber 104 that is higher than a pressure in the plasma source. In some other embodiments, the plasma source 102 is positioned directly in the chamber 104.

The plasma source 102 can be any type of plasma source that creates the required density of dopant ions. For example, the plasma source 102 can be an inductively coupled plasma source, a capacitively coupled plasma source, a DC plasma source, a microwave plasma source, an electron cyclotron resonance plasma source, a toroidal plasma source, a helicon plasma source, or a helical resonator plasma source.

The plasma source 102 shown in FIG. 1 is a RF inductively coupled plasma source that is described in more detail in U.S. patent application entitled "RF Plasma Source with Conductive Top Section," Ser. No. 10/905,172, filed on Dec. 20, 2004, which is assigned to the present assignee. The entire specification of U.S. patent application Ser. No. 10/905,172 is incorporated herein by reference.

The plasma source 102 includes a first section 106 formed of a dielectric material that extends in a horizontal direction. A second section 108 is formed of a dielectric material that extends a height from the first section 106 in a vertical direction. In the embodiment shown in FIG. 1, the second section 108 is formed in a cylindrical shape. It is understood that one skilled in the art will appreciate that the first section 106 does not need to extend in exactly a horizontal direction and the second section 108 does not need to extend in exactly a vertical direction.

The dimensions of the first and the second sections 106, 108 of the plasma source 102 can be selected to improve the uniformity of plasmas generated in the plasma source 102. In one embodiment, a ratio of the height of the second section 108 in the vertical direction to the length across the second section 108 in the horizontal direction is in the range of about 1.5 to 5.5.

The dielectric materials in the first and second sections 106, 108 provide a medium for transferring the RF power from the RF antenna to a plasma inside the plasma source 102. In one embodiment, the dielectric material used to form the first and second sections 106, 108 is a high purity ceramic material that is chemically resistant to the dopant gases and that has good thermal properties. For example, in some embodiments, the dielectric material is 99.6% Al2O3 or AlN. In other embodiments, the dielectric material is Yittria and YAG.

A top section 110 of the plasma source 102 is formed of a conductive material that extends across the top of the second section 108 in the horizontal direction. In some embodiments, the conductive material is aluminum. The material used to form the top section 110 is typically chosen to be chemically resistant to the dopant gases. The conductivity of the material used to form the top section 110 can be chosen to be high enough to dissipate a substantial portion of the heat load and to minimize charging effects that results from secondary electron emission.

In one embodiment, the top section 110 is coupled to the second section 108 with high temperature halogen resistant O-rings that are made of fluoro-carbon polymer, such as O-rings formed of Chemrz and/or Kalrex materials. The top section 110 is typically mounted to the second section 108 in a manner that minimizes compression on the second section 108, but that also provides enough compression to seal the top section 110 to the second section 108.

Some plasma doping processes generate a considerable amount of non-uniformly distributed heat on the inner surfaces of the plasma source 102 because of secondary electron emissions. The non-uniformly distributed heat creates temperature gradients on the inner surfaces of the plasma source 102 that can be high enough to cause thermal stress points within the plasma source 102 that can result in a failure. In some embodiments, the top section 110 comprises a cooling system that regulates the temperature of the top section 110 in order to dissipate the heat load generated during processing. The cooling system can be a fluid cooling system that includes cooling passages 112 in the top section 110 that circulates a liquid or gas coolant from a coolant source. Such cooling systems are well known in the art.

A RF antenna is positioned proximate to at least one of the first section 106 and the second section 108 of the plasma source 102. The plasma doping apparatus 100 illustrated in FIG. 1 shows a planar coil antenna 114 positioned adjacent to the first section 106 of the plasma source 102 and a helical coil antenna 116 surrounding the second section 108 of the plasma source 102. However, the plasma source 102 can have many different antenna configurations.

At least one of the planar coil antenna 114 and the helical coil antenna 116 is an active antenna. The term "active antenna" is herein defined as an antenna that is driven directly by a power supply. In other words, a voltage generated by a power supply is directly applied to an active antenna. In some embodiments, at least one of the planar coil antenna 114 and the helical coil antenna 116 is formed such that it can be liquid cooled. Cooling at least one of the planar coil antenna 114 and the helical coil antenna 116 will reduce temperature gradients caused by the RF power propagating in the RF antennas 114, 116.

In some embodiments, one of the planar coil antenna 114 and the helical coil antenna 116 is a parasitic antenna. The term "parasitic antenna" is defined herein to mean an antenna that is in electromagnetic communication with an active antenna, but that is not directly connected to a power supply. In other words, a parasitic antenna is not directly excited by a power supply, but rather is excited by an active antenna. In some embodiments of the invention, one end of the parasitic antenna is electrically connected to ground potential in order to provide antenna tuning capabilities. In this embodiment, the parasitic antenna includes a coil adjuster 115 that is used to change the effective number of turns in the parasitic antenna coil. Numerous different types of coil adjusters, such as a metal short, can be used.

A RF power supply 118 is electrically connected to the planar coil antenna 114. An impedance matching network 120 is used to maximize the power transferred from the RF power supply 118 to the planar coil antenna 114. A RF power supply 118' is electrically connected to the helical coil antenna 116. An impedance matching network 120' is used to maximize the power transferred from the RF power supply 118' to the planar helical antenna 116. In some embodiments, the RF power supplies 118, 118' are the same power supply. In some embodiments only one of the planar coil antenna 114 and the helical coil antenna 116 is powered.

A feed gas source 122 is coupled to the plasma source 102 through a proportional valve 124. In some embodiments, a gas baffle or gas distribution system 126 is used to disperse the gas into the plasma source 102. In some embodiments, at least one multi-port gas injection unit 127 is used to inject the feed gas into the plasma source 102. In some embodiments, a multi-port gas injection unit 127 is used to provide gases that cause neutral chemistry effects that result in across substrate variations.

A pressure gauge 128 measures the pressure inside the plasma source 102. An exhaust port 130 in the process chamber 104 is coupled to a vacuum pump 132 that evacuates the process chamber 104. An exhaust valve 134 controls the exhaust conductance through the exhaust port 130. A gas pressure controller 136 is electrically connected to the proportional valve 124, the pressure gauge 128, and the exhaust valve 134. The gas pressure controller 136 maintains the desired pressure in the process chamber 104 by controlling the exhaust conductance with the exhaust valve 134 and controlling the dopant gas flow rate with the proportional valve 124 in a feedback loop that is responsive to the pressure gauge 128.

In some embodiments, a differential pumping system is used to independently control the pressure in the plasma source 102 and in the process chamber 104. For example, in one embodiment, the differential pumping system includes a second exhaust port 130' in the plasma source 102 that is coupled to a second vacuum pump 132'. In some embodiments, the vacuum pumps 132, 132' are the same vacuum pump. A second exhaust valve 134' controls the exhaust conductance through the second exhaust port 130'. The second exhaust valve 134' is also electrically connected to the gas pressure controller 136.

In these embodiments, the gas pressure controller 136 maintains the desired pressure in both the plasma source 102 and the process chamber 104 by controlling the exhaust conductance with the exhaust valves 134, 134' and by controlling the dopant gas flow rate with the proportional valve 124 in a feedback loop that is responsive to the pressure gauge 128. In many embodiments, the differential pumping system maintains a locally high pressure in the chamber 104 relative to the plasma source 102. Maintaining a locally high pressure in the chamber 104 relative to the plasma source 102 allows the operator to optimize pressure for both ion production and for conformal ion implantation and sidewall deposition. Maintaining a locally high pressure in the chamber 104 relative to the plasma source 102 can also prevent the formation of a plasma in the region proximate to the substrate 150.

In some embodiments, a ratio control of trace gas species is provided by a mass flow meter (not shown) that is coupled in-line with the dopant gas that provides the primary dopant gas species. Also, in some embodiments, an additional gas injection means (not shown) is used for in-situ conditioning species. For example, silicon doped with an appropriate dopant can be used to provide a uniform coating in the process chamber 104 that reduces contaminants.

In some embodiments, the plasma doping apparatus 100 includes a plasma igniter 138. Numerous types of plasma igniters can be used with the plasma doping apparatus of the present invention. In one embodiment, the plasma igniter 138 includes a reservoir 140 of strike gas, which is a highly-ionizable gas, such as argon (Ar), which assists in igniting the plasma. The reservoir 140 is coupled to the plasma chamber 104 with a high conductance gas connection 142. A burst valve 144 isolates the reservoir 140 from the process chamber 104. In another embodiment, a strike gas source is plumbed directly to the burst valve 144 using a low conductance gas connection. In some embodiments, a portion of the reservoir 140 is separated by a limited conductance orifice 146 or metering valve that provides a steady flow rate of strike gas after the initial high-flow-rate burst.

A platen 148 is positioned in the process chamber 104 proximate to the plasma source at a height below the top section 110 of the plasma source 102. The platen 148 holds a target or substrate 150 having planar and nonplanar features for ion implantation. In many embodiments, the substrate 150 is electrically connected to the platen 148. In some embodiments, at least one gas conductance barrier 105 is used to increases the local pressure proximate to the platen 148 and the substrate 150. In the embodiment shown in FIG. 1, the platen 148 is parallel to the plasma source 102. However, in other embodiments of the present invention, the platen 148 is tilted with respect to the plasma source 102.

In one embodiment, the platen 148 is mechanically coupled to a movable stage 152. For example, the movable stage 152 can be a translation stage that scans the substrate 150 in at least one direction. The movable stage 152 can also be a dither generator or an oscillator that dithers or oscillates the substrate 150. In one embodiment, the movable stage 152 is a rotation stage that rotates the substrate 150. The translation, dithering, oscillation, and/or rotation motion reduces or eliminates shadowing effects and improves the uniformity of the ion beam flux impacting the surface of the substrate 150. The rotation motion can also be used to control multi-step dopant ion implants.

In some embodiments, the process chamber 104 includes a temperature controller 149 that controls the temperature of the substrate 150. In some embodiment, the temperature controller 149 changes the temperature of the substrate 150 to increase a rate of outgassing from substrate surface layers, which raises the local pressure proximate to the substrate 150 as described herein. In other embodiments, the temperature controller 149 controls the temperature of the substrate 150 to cause condensation on the substrate 150 that increases a local pressure proximate to the substrate 150 as described herein.

In some embodiments, a material 151 is positioned proximate to the substrate 150 that increases a scattering cross section to dopant ions when activated by, for example, increasing the temperature of the material 151 and/or exposing the material 151 to dopant ions. Increasing the scattering cross section will increase a probability of collisions between dopant ions incident to the substrate 150 and scattering species and, therefore, will increase a rate of depositing dopant ions on the nonplanar features of the substrate 150.

In some of these embodiments, the material 150 is chosen to either evaporate or sublime when the temperature of the material 151 is increased. In these embodiments, the temperature controller 148 (or another temperature controller) is used to adjust the temperature of the material 151 to a temperature that causes either evaporation or sublimation. The evaporation or sublimation increases the probability of collisions between incident dopant ions and scattering species, which increasing a rate of depositing dopant ions on the nonplanar features of the substrate 150.

In some of these embodiments, the material 150 is chosen to either evaporate or sublime when the material 150 is exposed to the dopant ions. The evaporation or sublimation increases the probability of collisions between incident dopant ions and scattering species, which increases a rate of depositing incident dopant containing material and ions on the nonplanar features of the substrate.

In the embodiment shown in FIG. 1, a grating 154 is positioned in the process chamber 104 adjacent to the platen 148. Other embodiments do not include a grating. The term "grating" is defined herein as a structure that forms a barrier to the plasma generated by the plasma source 102 and that defines passages through which the ions in the plasma pass through when the grating is properly biased. The area of the grating 154 is typically greater than or equal to the area of the substrate 150 being implanted.

The region 156 between the grating 154 and the platen 148 can be dimensioned to reduce the number of ion collisions in the region 156. The substrate 150 and the grating 154 are oriented together so that the dopant ions extracted from the grating 154 impact the substrate 150 at a desired angle of incidence. In some embodiments, the desired angle of incidence is a non-normal angle.

In one embodiment, the grating 154 is formed of a non-metallic material or a metallic material that is completely coated with a non-metallic material. For example, the grating 154 can be formed of doped silicon (poly or single crystal), silicon carbide, and silicon coated aluminum. Such materials work well with hydride and fluoride chemistries.

The grating 154 can be straight as shown in FIG. 1 or can be formed in numerous other shapes, such as a saw tooth shape. In one embodiment, the grating 154 is a grid with apertures. In another embodiment, the grating 154 is a structure that defines slots. In yet another embodiment, the grating 154 is a perforated mesh structure.

A fill factor of the grating 154 can be selected to achieve a certain ion current at the surface of the substrate 150 or to limit the extent of the plasma into the region 156 between the grating 154 and the platen 148. The term "fill factor" is defined herein to mean the ratio of the open area of the grating 154 that passes dopant ions to the solid area of the grating 154 that blocks the dopant ions. The fill factor can also be selected to prevent formation of a plasma in the region 156 between the grating 154 and the platen 148.

In one embodiment, the grating 154 is mechanically coupled to a movable stage 158. The movable stage 158 can be a dither generator or an oscillator that dithers or oscillates the grating 154. In this embodiment, the movable stage 158 dithers or oscillates the grating 154 in a direction that is perpendicular to slots in the grating 154. The movable stage 158 dithers or oscillates the grating 154 in two directions if the grating 154 forms apertures or a mesh pattern. The movable stage 158 can also be a rotation stage that rotates the grating 154. The translation, dithering, oscillation, and/or rotation motions reduce or eliminate shadowing effects and improve the uniformity of the ion beam flux impacting the surface of the substrate.

In some embodiments, a bias voltage power supply 160 is used to bias at least one of the grating 154 and the substrate 150 so that dopant ions in the plasma are extracted from the grating 154 and impact the substrate 150. The bias voltage power supply 160 can be a DC power supply, a pulsed power supply, or a RF power supply. An output of the bias voltage power supply 160 is electrically connected to at least one of the grating 154 and the substrate 150. Dashed lines from the output of the bias voltage power supply 160 to the grating 154 and to the substrate 150 are shown to indicate that embodiments which include the bias voltage power supply 160 can have electrical connections made from the output of the bias voltage power supply 160 to either or both of the grating 154 and the substrate 150.

In the embodiment shown in FIG. 1, the output of the bias voltage power supply 160 is electrically connected to both the grating 154 and the substrate 150 so that the grating 154 and the substrate 150 are at substantially the same potential. In this embodiment, the region 156 between the grating 154 and the substrate 150 is at substantially a constant potential and thus, is a field free region. One skilled in the art will appreciate that the conformal plasma doping apparatus of FIG. 1 has many different possible biasing configurations.

In one embodiment, an electrode 162 is positioned proximate to the grating 154. The electrode 162 can be positioned adjacent to the grating 154 as shown in FIG. 1. In this embodiment, the electrode 162 has the same fill factor and grating pattern as the grating 154 and is aligned to the grating 154 so that ions pass through both the grating 154 and the electrode 162. The electrode 162 is biased at substantially the same potential as the grating 154 so that at least a portion of the electrons generated by the substrate 150 are absorbed by the electrode 162.

In one embodiment, a magnet or any source of magnetic field is positioned proximate to the grating 154 and to the substrate 150 so that a magnetic field is generated in the region 156 between the grating 154 and the substrate 150. The magnetic field traps at least a portion of the electrons that are located proximate to the substrate 150.

In some embodiments, a second plasma source can be positioned inside the chamber 104 that generates dopant ions from a second feed gas. The second plasma source can be any type of plasma source, such as an inductively coupled plasma source, a capacitively coupled plasma source, a DC plasma source, a microwave plasma source, an electron cyclotron resonance plasma source, a toroidal plasma source, a helicon plasma source, and a helical resonator plasma source. In many embodiments, the second plasma source generates substantially the same dopant ions as the plasma source 102. However, in some embodiments, the second plasma source generates dopant ions that are different from the dopant ions generated by the plasma source 102.

Figure 2:
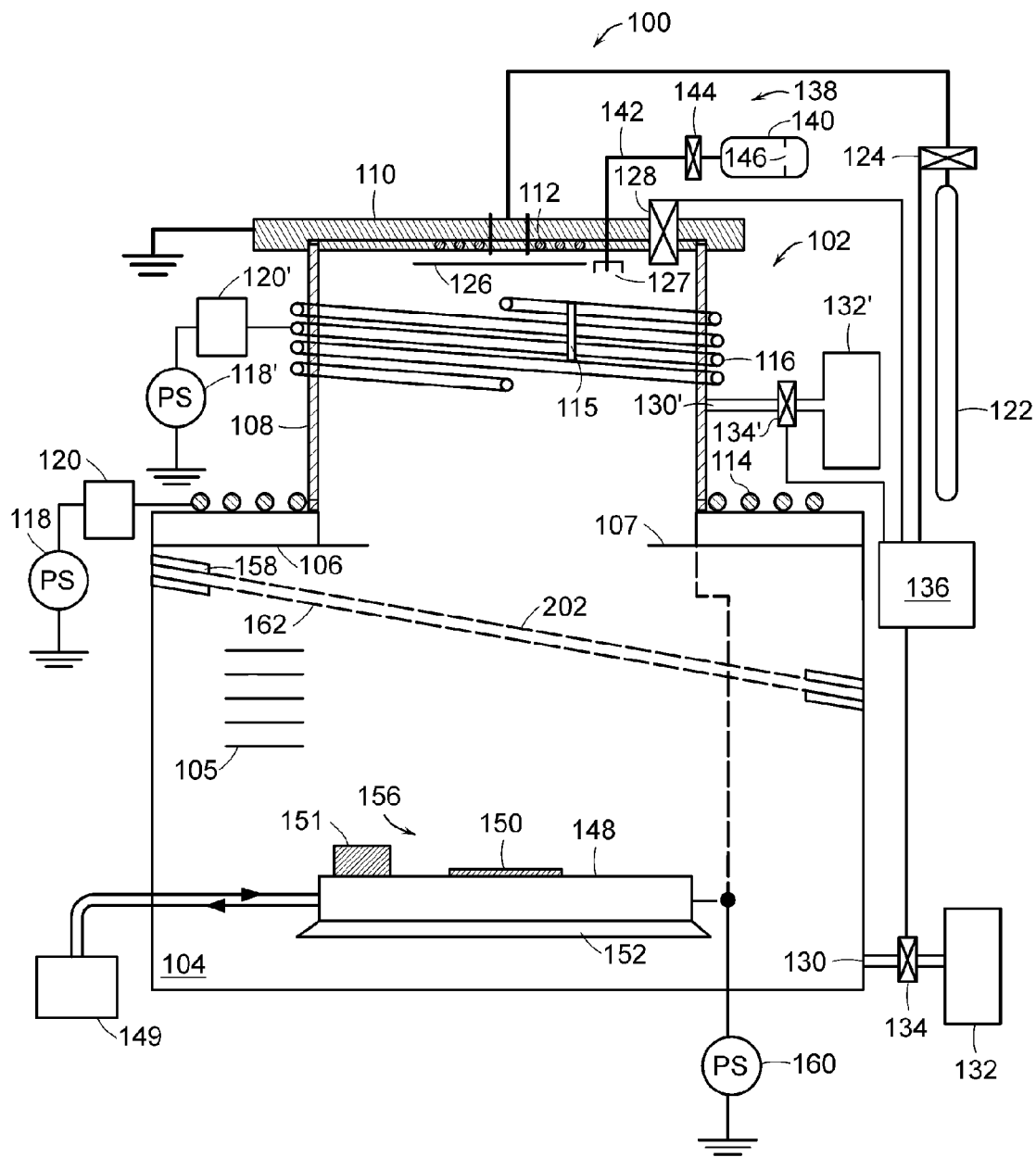
FIG. 2 illustrates another embodiment of a conformal plasma doping apparatus according to the present invention that includes a tilted grating.

FIG. 2 illustrates another embodiment of a conformal plasma doping apparatus 200 according to the present invention that includes a tilted grating 202. The plasma doping apparatus 200 is similar to the plasma doping apparatus 100 except that the grating 154 is tilted at a predetermined angle with respect to both the plasma source 102 and the platen 148. In other embodiments, the platen 148 is designed and/or positioned so that the substrate 150 is at a non-zero angle with respect to both the plasma source 102 and the grating 202.

The platen 148 can be mechanically translated, dithered, oscillated, and/or rotated with the movable stage 152 as described in connection with FIG. 1. The grating 154 can also be mechanically translated, dithered, oscillated, and/or rotated with the movable stage 152 as described in connection with FIG. 1. The translation, dithering, oscillation, and/or rotating of at least one of the substrate 150 and the grating 154 can minimizes or eliminate ion shadowing effects and, therefore, can improve the uniformity of the ion flux impacting the surface of the substrate 150.

The operation of the conformal plasma doping systems described in connection with FIGS. 1 and 2 includes generating dopant ions with the plasma source 102 from a volume of feed gas. Any type of feed gas can be used. For example, the feed gas can be a hydride feed gas, such as $B_2H_6$, $PH_3$, and $AsH_3$, or a fluoride feed gas, such as $BF_3$, $PF_3$, $PF_5$, and $AsF_5$. In some embodiments, the dopant ions are generated in a chamber (not shown) that is remotely located relative to the substrate 150. Also, in some embodiments, the dopant ions are generated directly in the chamber 104 proximate to the substrate 150 with the second plasma source located proximate to the substrate 150.

The dopant ions are passed to the platen 148 that supports the substrate 150 having planar and nonplanar features. In some embodiments, the dopant ions pass through the grating 154, 202 to the substrate 150. In some embodiments, the bias voltage is applied to at least one of a platen 148 supporting the substrate 150 and the grating 154, 202 that is positioned proximate to the platen 148 in order to extract the dopant ions towards the substrate 150.

The dopant ions passing through or extracted from the grating 154, 202 are implanted into both the planar and nonplanar features on the surfaces of the substrate 150. At least one of the conformal doping parameter, such as the pressure proximate to the substrate 150, the flow rate of the feed gas, the power of the plasma, and the bias voltage applied to the platen 148, is chosen so that the desired doping profile of the planar and nonplanar features of the substrate 150 is achieved after annealing. In one specific embodiment, the parameters are chose so that uniform conformal doping of the planar and nonplanar features of the substrate 150 is achieved after annealing. In this embodiment, the doping profile of the nonplanar features approximately matches the doping profile of the planar features.

In one embodiment, the conformal doping parameters are chosen so that a pressure proximate to the substrate 150 causes a relatively high probability of collisions between incident dopant ions and scattering species. The relatively high rate of collisions between incident dopant ions and scattering species increases the rate of implanting dopant ions into the non-planar features relative to the rate of implanting dopant ions into the planar features.

In many embodiments, the substrate 150 is annealed to diffuse dopant ions in the planar and nonplanar features of the substrate 150 and to activate the dopant ions in the substrate 150. In some embodiments, rapid thermal annealing is performed. Also, in some embodiments, multi-step annealing or multi-step rapid thermal annealing is performed. The annealing times and temperature are chosen so that the desired doping profile of the planar and nonplanar features of the substrate is achieved.

Figure 3:
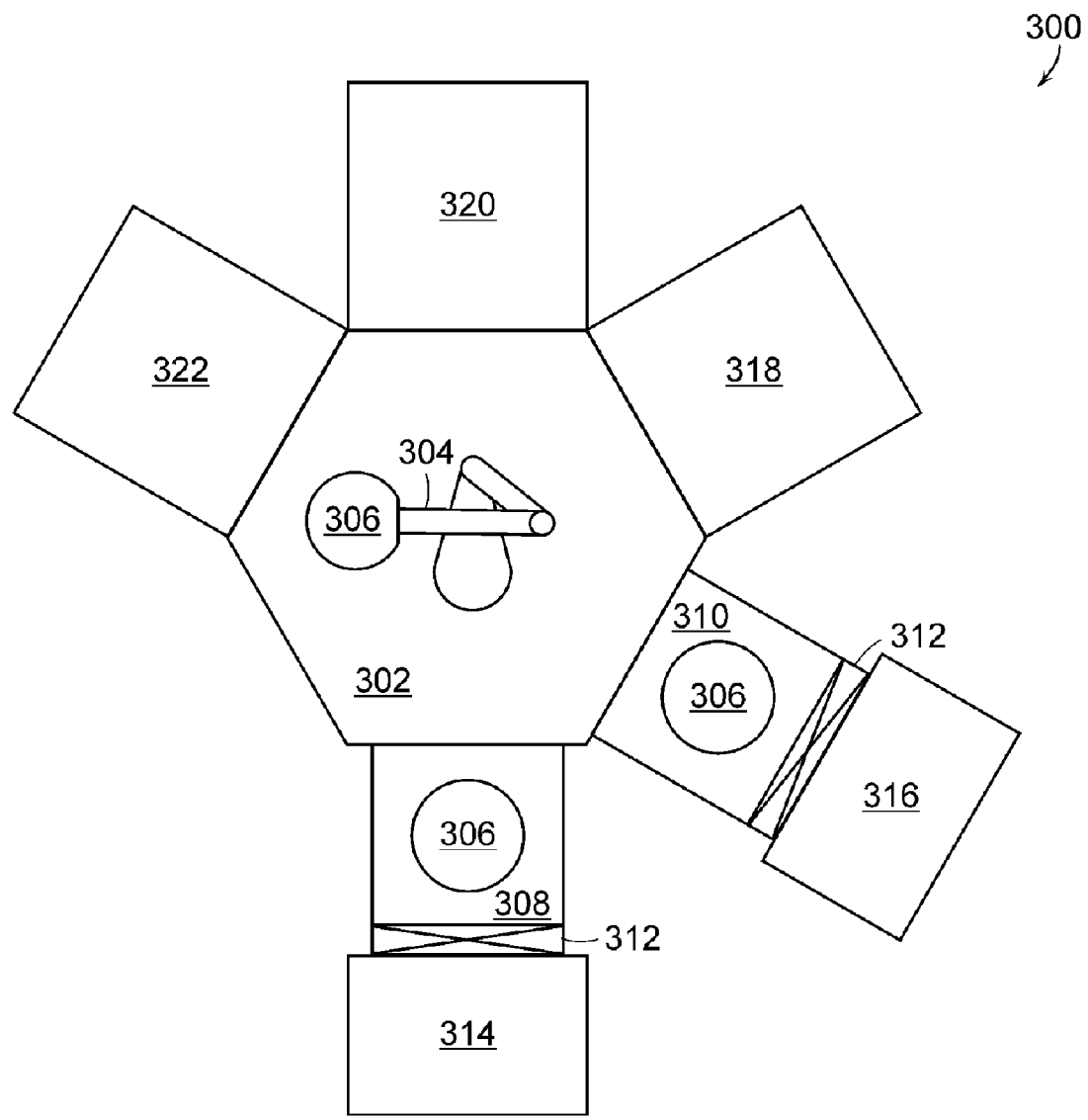
FIG. 3 illustrates the integration of a conformal plasma doping apparatus into a cluster tool.

FIG. 3 illustrates the integration of a conformal plasma doping apparatus into a cluster tool 300. The cluster tool 300 includes a central substrate transfer system 302 having a robotic arm 304 that transfers substrates 306 between the various chambers of the cluster tool 300. The cluster tool 300 includes a first 308 and a second load lock 310 that is attached to the central substrate transfer system 302. One skilled in the art will appreciate that a cluster tool according to the present invention can include any number of load locks and may include more than one substrate transfer system 302. Each of the first and the second load locks 308, 310 include a gate valve 312 that separates the central substrate transfer system 302 from respective airlocks 314, 316 that receive substrates 306 for processing and that retrieve substrates 306 after processing.

The cluster tool 300 includes three processing chambers or processing systems. One skilled in the art will appreciate that a cluster tool according to the present invention can include any number of processing chambers or processing systems. For example, the first processing chamber 318 can include the conformal doping apparatus 100, 200 that are described in connection with FIGS. 1 and 2. In one embodiment, the second processing chamber 320 includes a photoresist stripping chamber that is used to remove photoresist or other masking or patterning materials after conformal doping and before high temperature processing steps, such as annealing steps. In one embodiment, the third processing chamber 322 includes an annealing furnace, such as a rapid thermal annealing furnace that is used to drive in dopant ions and to active dopant ions in the substrate.

In other embodiments a fourth processing chamber (not shown) or one of the other processing chambers 320, 322 includes a deposition system that deposits materials on the substrates. Some conformal doping processes according to the present invention require deposition of doping materials or blocking layers before the conformal doping step. Other processes according to the present invention require deposition of materials after the doping step or processing, such as plasma processing to generate an oxidation layer. Yet other processes according to the present invention require deposition of materials both before and after processing. For example, a deposition chamber can be used to deposit materials that outgas during the conformal doping step in order to increase the rate of implanting dopant ions into nonplanar features of a substrate as described herein. The deposition chamber can also be used to deposit materials for knock-on doping as described herein.

The cluster tool 300 is very versatile and can be used to perform many different conformal plasma doping processes. In one example, the cluster tool 300 is used to deposit materials for increasing the rate of implanting dopant ions into nonplanar features of a substrate 306 in one chamber. The cluster tool 300 then performs a conformal doping process according to the present invention in another chamber. The cluster tool 300 then strips photoresist or other masking or patterning materials in another chamber using reactive plasma processing. Finally, the cluster tool 300 performs an annealing step, such as a rapid thermal annealing step, that drives the dopant ions into the substrate 150 and that actives the dopant ions with the substrate 150.

Figure 4:
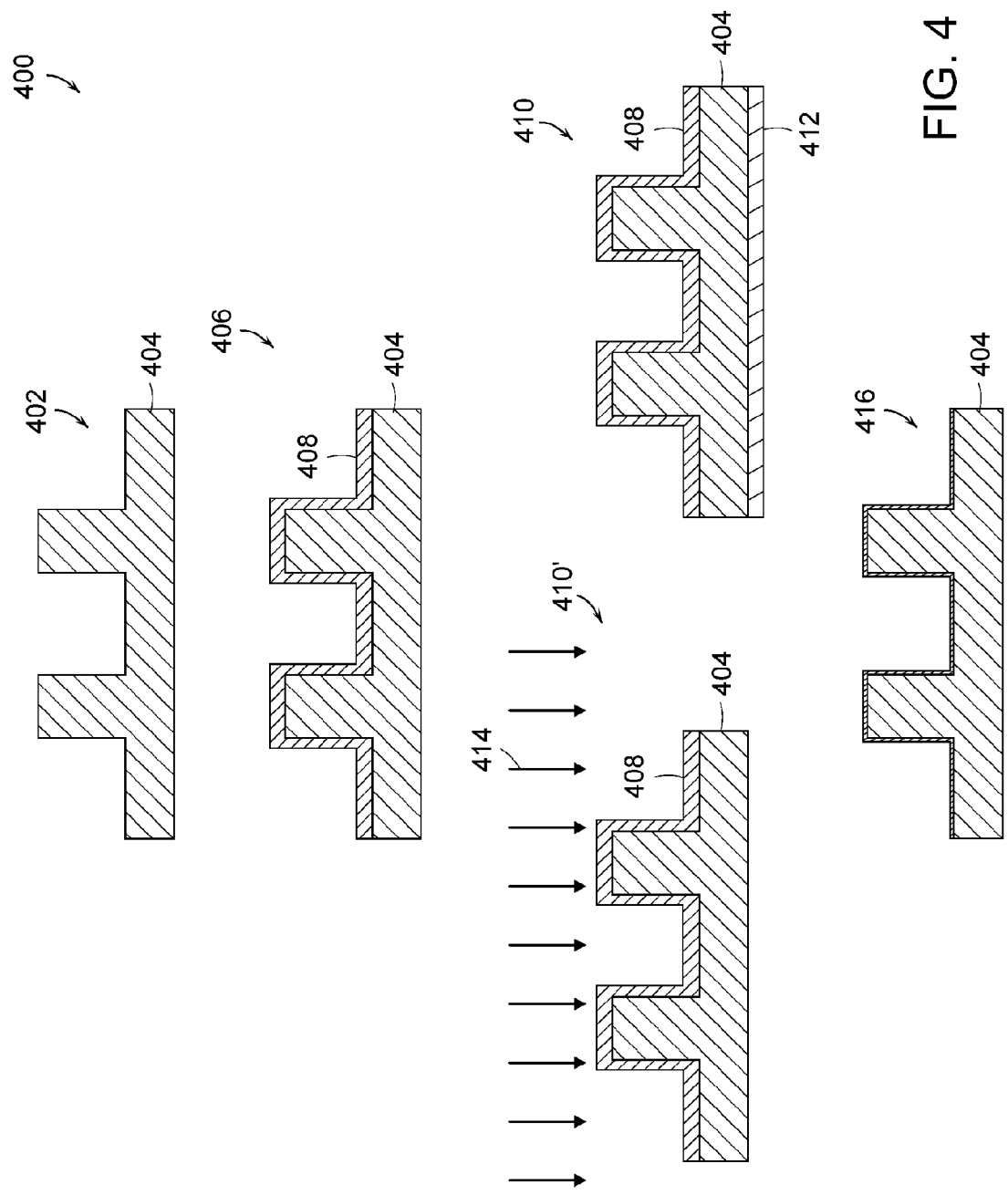
FIG. 4 illustrates a process diagram of a method of conformal doping according to the present invention that uses materials that increase the rate of implanting dopant ions into nonplanar features of a substrate.

FIG. 4 illustrates a process diagram 400 of a method of conformal doping according to the present invention that uses materials that increase the rate of implanting dopant ions into nonplanar features of a substrate. In a first step 402, a substrate 404 having both planar and nonplanar features is prepared for conformal doping. The substrate 404 is cleaned to remove impurities before ion implantation. In some embodiments, a blocking layer is deposited on the cleaned substrate 404 as described in connection with FIG. 5. The thickness and composition of the blocking layer are chosen so that dopant ion penetration into the planar features of the substrate 404 is reduced to a desired ion penetration that achieves the desired doping profile in the planar features after annealing.

In the second step 406, a material 408 is deposited, which when activated, increases the probability of collisions between incident dopant ions and scattering species. In some embodiments, the material 408 is deposited on the substrate 404. In other embodiments, the material 408 is placed proximate to the substrate 404 prior to performing the implant step.

In the third step 410, the material 408 is activated so that the material 408 increases the probability of collisions between incident dopant ions and scattering species. The type of activation depends upon the materials 410 and the methods used to increase the probability of collisions between incident dopant ions and scattering species.

In one embodiment, a temperature controller 412 activates the material 408 by changing the temperature of the material 408. In this embodiment, the material 408 is chosen to perform at least one of evaporation and sublimation when the temperature of the material 408 is controlled to a certain temperature. Alternatively, the material 408 can be chosen to form condensation when the temperature of the material 408 is controlled to a certain temperature.

Therefore, in this embodiment, the third step 410 includes changing the temperature of the substrate 404 with a temperature controller 412 so that the material 408 activates to cause evaporation, sublimation or condensation. The resulting evaporation, sublimation or condensation increases the probability of collisions between incident dopant ions and scattering species and, therefore, increases the rate of implanting dopant ions into nonplanar features of the substrate 404 for particular conformal doping parameters. In one embodiment, the rate of implanting dopant ions into nonplanar features of the substrate 404 results in a doping profile of the nonplanar features after annealing that approximately matches a doping profile of the planar features after annealing.

In an alternative embodiment, the third step 410' includes activating the material 408 by exposing the material 408 to dopant ions 414. In this embodiment, the material 408 is chosen to perform at least one of evaporation and sublimation when dopant ions 412 impact the material 408. Therefore, in this embodiment, the third step 410 includes impacting the material 408 with dopant ions 412 having a certain predetermined energy range that activates the material 408 to cause evaporation or sublimation. The dopant ions 414 can be impacted into the material 408 by using any type of ion implantation, such as beam-line ion implantation and PIII.

FIG. 4 illustrates the dopant ions 412 impacting the material 408 at a normal angle to the surface of the material 408. However, it is understood that the dopant ions 412 can impact the surface of the material 408 at non-normal angles as well. The resulting evaporation or sublimation increases the probability of collisions between incident dopant ions and scattering species and, therefore, increases the rate of implanting dopant ions into nonplanar features of the substrate 404 for particular conformal doping parameters. In one embodiment, the rate of implanting dopant ions into nonplanar features of the substrate 404 results in a doping profile of the nonplanar features after annealing that approximately matches a doping profile of the planar features after annealing.

In a fourth step 416, the photoresist and other masking materials is stripped from the substrate 404. The photoresist or other material layers can be stripped with wet chemical or dry etching or a combination of both wet chemical and dry etching. Also, in the fourth step, the substrate 404 is annealed to activate the dopant ions. One skilled in the art will appreciate that any type of annealing can be used. For example, the substrate 404 can be anneal using one or more of rapid thermal annealing, laser annealing, and flash annealing.

Figure 5:
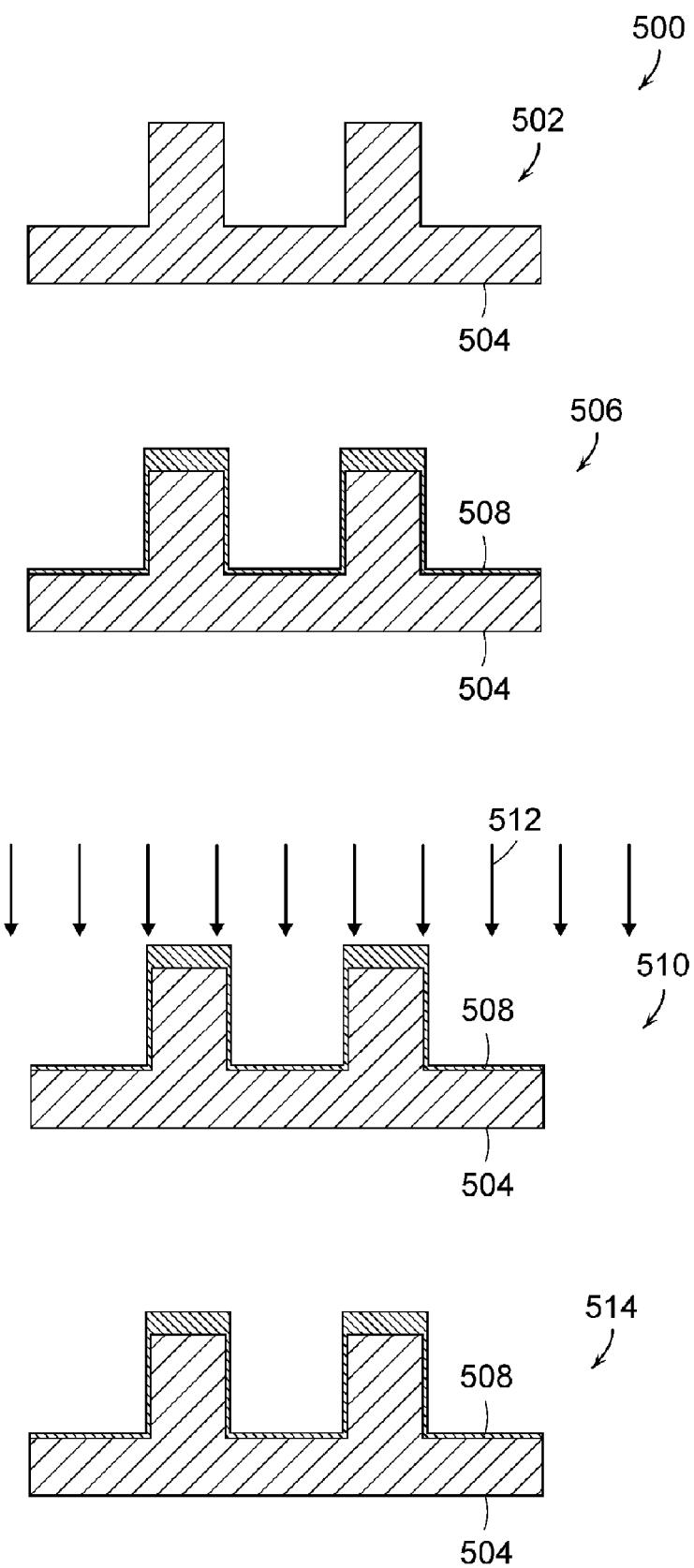
FIG. 5 illustrates a process diagram of a method of conformal doping according to the present invention that uses a blocking layer of material.

FIG. 5 illustrates a process diagram 500 of a method of conformal doping according to the present invention that uses a blocking layer of material. In the first step 502, a substrate 504 having both planar and nonplanar features is prepared for conformal doping. The substrate 504 is cleaned to remove impurities before ion implantation.

In the second step 506, a blocking layer 508 is deposited on the planar features of the substrate 504. The thickness and composition of the blocking layer 508 are chosen so that dopant ion penetration into the planar features of the substrate 504 is reduced to a desired ion penetration that achieves the desired doping profile in the planar features after annealing.

In the third step 510, dopant ions 512 are generated and directed towards the substrate 504. The dopant ions 512 impact the blocking layer 508 where they lose some of their energy and, consequently, reduce their penetration into the planar features of the substrate 504. The dopant ions 512 can be impacted into the blocking layer 508 by using any type of ion implantation, such as beam-line ion implantation and PIII. FIG. 5 illustrates the dopant ions 512 impacting the blocking layer 508 at a normal angle to the surface of the material 408. However, it is understood that the dopant ions 412 can impact the blocking layer 508 at non-normal angles as well.

In some embodiments, at least some of the first and the second steps 502, 506 are performed simultaneously so that at least a portion of the blocking layer 508 is formed while passing the dopant ions 512 towards the substrate 504. In other embodiments, the first step 502 is completed before the start of the second step 506 so the entire blocking layer 508 is formed prior to passing the dopant ions 512, 512' towards the substrate 504.

A method of implanting dopant ions into the nonplanar features of the substrate 504 is also performed. The implanting the dopant ions into the nonplanar features of the substrate 504 can be preformed separately or simultaneously with impacting the dopant ions into the blocking layer 508. The implanting process is not limited to the methods of implanting dopant ions into nonplanar features of a substrate as described herein. Any method of implanting dopant ions into nonplanar features of a substrate can be used.

In the fourth step 514, the substrate 504 is annealed to drive dopant ions into the nonplanar and planar surfaces of the substrate 504 and to activate the dopant ions in the substrate 504. One skilled in the art will appreciate that any type of annealing can be used. For example, the substrate 504 can be annealed using one or more of rapid thermal annealing, laser annealing, and flash annealing. In one embodiment, the thickness and composition of the blocking layer 508 of material as well as the dose of the dopant ions implanted into the planar and the nonplanar features of the substrate is selected so that the doping profile of the nonplanar features after annealing approximately matches the doping profile of the planar features after annealing.

Figure 6:
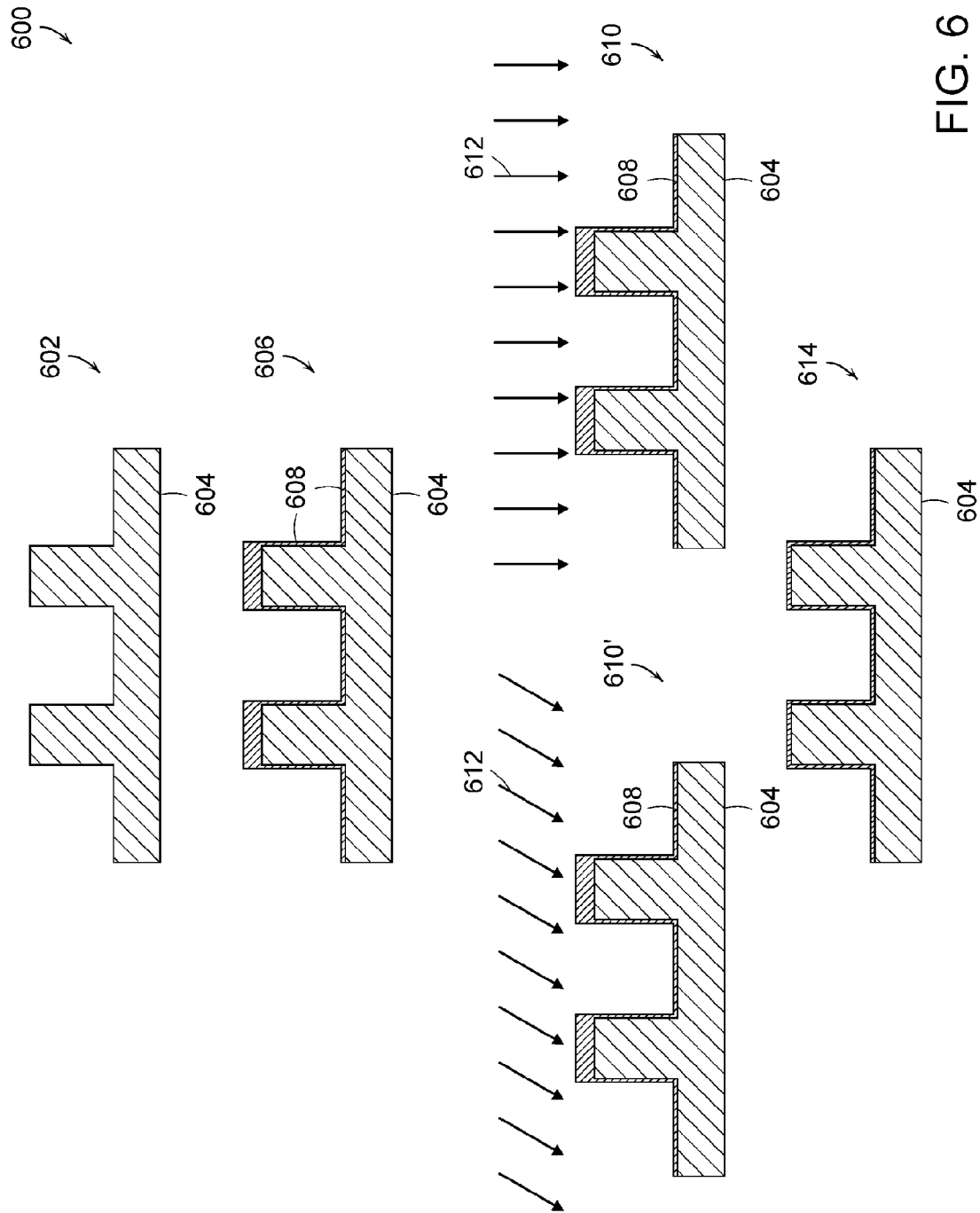
FIG. 6 illustrates a process diagram of a method of knock-on conformal doping according to the present invention.

FIG. 6 illustrates a process diagram 600 of a method of knock-on conformal doping according to the present invention. In the first step 602, a substrate 604 with both planar and nonplanar features is prepared for deposition of dopant containing material. The substrate 604 is cleaned to remove impurities before ion implantation. In some embodiments, a blocking layer is deposited on the cleaned substrate 604 as described in connection with FIG. 5. The thickness and composition of the blocking layer are chosen so that dopant ion penetration into the planar features of the substrate 604 is reduced to a desired ion penetration that achieves the desired doping profile in the planar features after annealing.

In the second step 606, a layer of dopant containing material 608 is anisotropically deposited on the planar and the nonplanar features of a substrate 604. The thickness of the layer of dopant containing material 608 on the planar surfaces of the substrate 604 is significantly greater than the thickness of the layer of dopant containing material 608 on the sides of the nonplanar features on the substrate 604. The desired ratio of the thickness of the layer of dopant containing material 608 on the planar surfaces of the substrate 604 to the thickness of the layer of dopant containing material 608 on the sides of the nonplanar features on the substrate 604 depends on factors, such as the sidewall angle of the nonplanar features and the knock-on implant parameters. In some embodiments, the thickness of the layer of dopant containing material 608 on the planar features of the substrate 604 is in the range of 1 to 100 times the thickness of the layer of dopant containing material 608 on the nonplanar features.

One skilled in the art will appreciate that the layer of dopant containing material 608 can be deposited by numerous deposition means known in the art. In some embodiments, the layer of dopant containing material 608 is deposited using a hydride or fluoride gas, such as $B_2H_6$, $PH_3$, $AsH_3$, $BF_3$, $PF_3$, $PF_5$, and $AsF_5$. The deposition of the dopant containing material can be performed in the plasma doping chamber or can be performed in separate or connected, but different processing chamber. In some embodiments, the deposition of the dopant containing material 608 is performed in a chamber of a cluster tool, such as the cluster tool 300 that is described in connection with FIG. 3.

In the third step 610, dopant material is delivered to different features on the substrate 604 through a knock-on implant. The term "knock-on implant" is defined herein as a recoil implantation where a non-dopant species is implanted through the surface layers of the substrate 604 to drive the dopant material into the substrate 604. In many embodiments, the non-dopant species used for the knock-on implant is a benign species.

In one embodiment, inert ions 612 are formed from an inert feed gas. In some embodiments, the inert feed gas includes at least one of He, Ne, Ar, Kr and Xe. In some embodiments, the mass of the inert ions 612 is chosen to be similar to a mass of the desired dopant ions. The inert ions 612 are extracted towards the substrate 604 with a sufficient energy to physically knock the deposited dopant material into both the planar and nonplanar features of the substrate 604 upon impact.

The third step 610, 610' is illustrated with two different inert ion 612 impact angles. In one embodiment, the third step 610 includes impacting the planar surfaces (top and bottom surfaces) of the substrate 604 with inert ions 612 at a normal angle and impacting the vertical sidewalls of the substrate 604 at an angle of about 85 degrees. In an alternative embodiment, the inert ions 612 impact both the planar surfaces (top and bottom surfaces) of the substrate 604 and the vertical sidewalls of the substrate 604 at a non-normal angle.

In some embodiments, the inert ions 612 are implanted by PIII. A bias voltage is applied to at least one of the platen 148 (FIGS. 1 and 2) supporting the substrate 504 and to the grating 154, 202 (FIGS. 1 and 2) positioned proximate to the platen 148. In one embodiment, the bias voltage is the DC portion of a pulsed cycle that is used for plasma doping. The bias voltage can also be a DC or an AC bias voltage. The bias voltage is adjusted to achieve the desired inert ion energy that will result in the desired doping profile of the planar and nonplanar features of the substrate after annealing. In another embodiment, the inert ions 612 are extracted towards the substrate 150 with a beam-line ion implanter.

In an alternative embodiment, the third step 610' includes extracting the inert ions 612 towards the substrate 604 at a non-normal angle relative to the planar surface of the substrate 604. Extracting the inert ions 612 towards the substrate 604 at a non-normal angle relative to the planar surface of the substrate 604 can be achieved in several ways. For example, the substrate 604 or platen 148 (FIGS. 1 and 2) can be tilted relative to the plasma source 102 (FIGS. 1 and 2). Also, the grating 202 (FIG. 2) can be tilted relative to the plasma source 102 and the platen 148 as shown in FIG. 2.

In the fourth step 614, the photoresist and/or other masking materials are stripped from the substrate 604. The photoresist and/or other masking materials can be stripped with wet chemical or dry etching or a combination of both wet chemical and dry etching. Also, in the fourth step, the substrate 604 is annealed to activate the dopant ions. One skilled in the art will appreciate that any type of annealing can be used. For example, the substrate 604 can be annealed using one or more of rapid thermal annealing, laser annealing, and flash annealing.

Thus, a method of knock-on conformal doping according to the present invention includes depositing a layer of dopant material on nonplanar and planar features of a substrate. In some embodiments, the thickness of the deposited layer on the planar features is in a range that is between 1-100 times the thickness of the deposited layer on the nonplanar features. Inert ions are generated from an inert feed gas, such as He, Ne, Ar, Kr and Xe. In some embodiments, the mass of the inert ions is chosen to be similar to the mass of the dopant ions.

The inert ions are extracted towards the substrate so that the inert ions physically knock the dopant material into both the planar and nonplanar features of the substrate. The depositing the layer of dopant material on the nonplanar features of the substrate and the extracting the inert ions towards the substrate can be performed in the same or in different process chambers. The inert ions can be extracted towards the substrate at a non-normal angle relative to the planar surface of the substrate. In some embodiments, the inert ions are extracted with a beam-line ion implanter.

In some embodiments, the inert ions are extracted by applying a bias voltage to at least one of a platen supporting the substrate and a grating positioned proximate to the platen. The substrate can be biased with at least one of a DC, pulsed DC, and an AC bias while extracting the inert ions towards the substrate. At least one of an amplitude, a repetition rate, and a pulse width is chosen to achieve a desired doping profile of the planar and nonplanar features of the substrate after annealing. In one embodiment, at least one of a thickness of the layer of dopant material, a density of inert ions generated, a pressure proximate to the substrate, and a voltage applied to at least one of the platen supporting the substrate and a grating is chosen so that the doping profile of the nonplanar features approximately matches a doping profile of planar surfaces.

Figure 7:
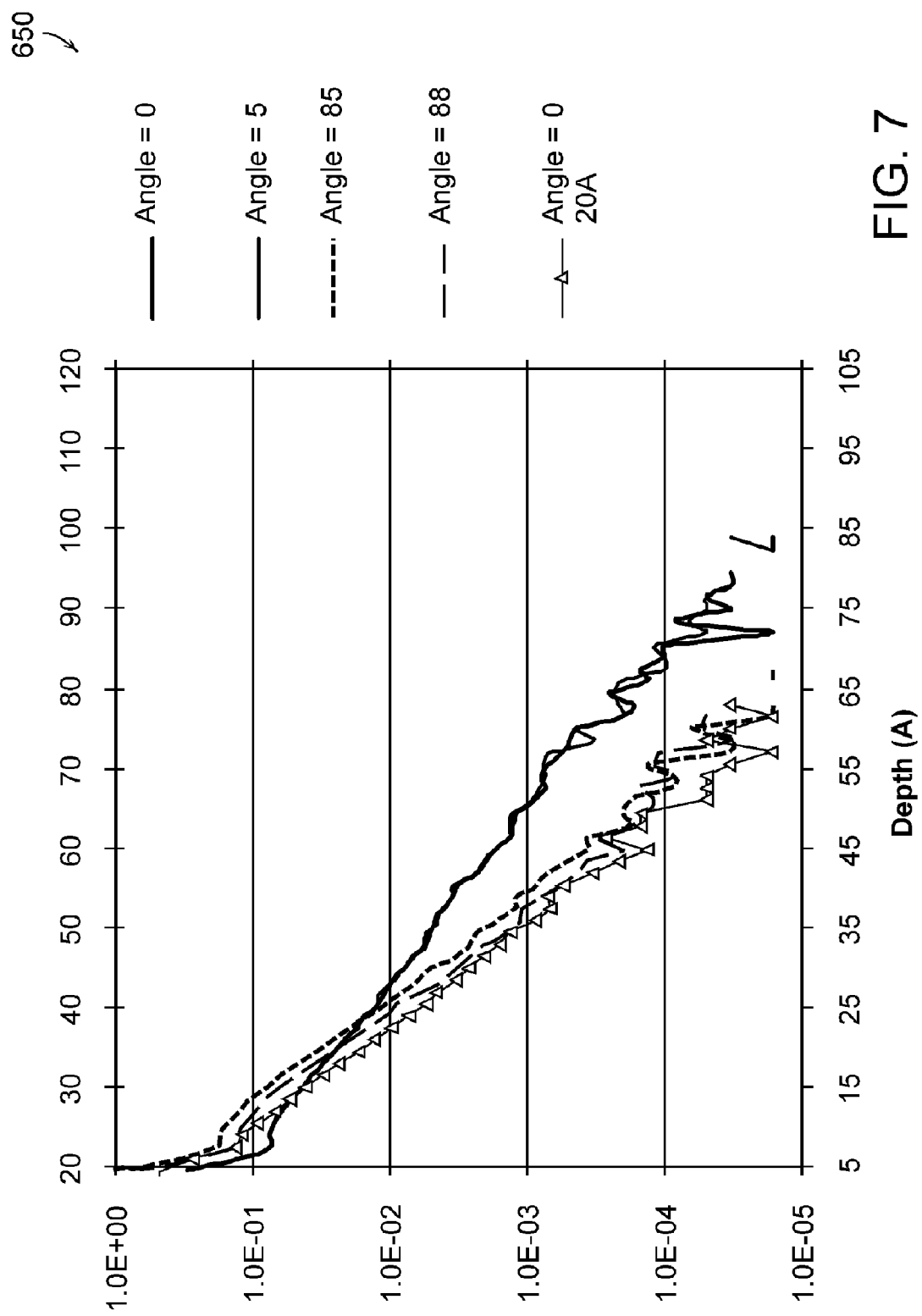
FIG. 7 illustrates a graph of simulation results for knock-on conformal doping according to the present invention.

FIG. 7 illustrates a graph 650 presenting simulation results for knock-on conformal doping according to the present invention. The method of doping was simulated using the process described in the process diagram 600 of FIG. 6. The simulation results assume a layer of Boron that is deposited on the silicon substrate before the knock-on implant. The Boron layer is five angstroms thick on the nonplanar features and twenty angstroms thick on the planar features of the substrate 604. The knock-on implant was simulated with a 500 eV Argon ion beam that was sufficient to knock the deposited dopant material into both the planar and nonplanar features of the substrate.

The graph 650 shows experimental data for Boron recoil distribution as a function of depth for zero degree, 5 degree, 85 degree, and 88 degree implant angles. The simulation data shows how the implant angle affects the doping profile. The zero and five degree implants indicate the Boron recoil distribution on the planar features of the substrate. The larger angle (85 and 88 degrees) implants indicate the Boron recoil distribution on the sidewalls. The goal for conformal doping is to match the redistribution profiles on the planar and sidewall features of the devices. The graph 650 indicates that conformal doping can be achieved using the method of the present invention. The graph 650 indicates a close match between the B distributions obtained for zero degree Ar implants through a 20 Angstrom layer of surface B layer and the 85 or 88 degree Ar implants through a 5 Angstrom layer of B surface layer.

Theses results indicate that if the ratio of thickness of B containing layers is controlled, then it may be possible to get matching (i.e. conformal) B redistribution profiles on the top (or bottom) and the sidewalls of a three-dimensional fin-like or trench structures. The actual thickness of the dopant containing films on the planar and non-planar features will be determined by the sidewall angles, the desired dopant depth and concentration, the energy of the knock-on implant as well as the knock-on and dopant species used.

Figure 8:
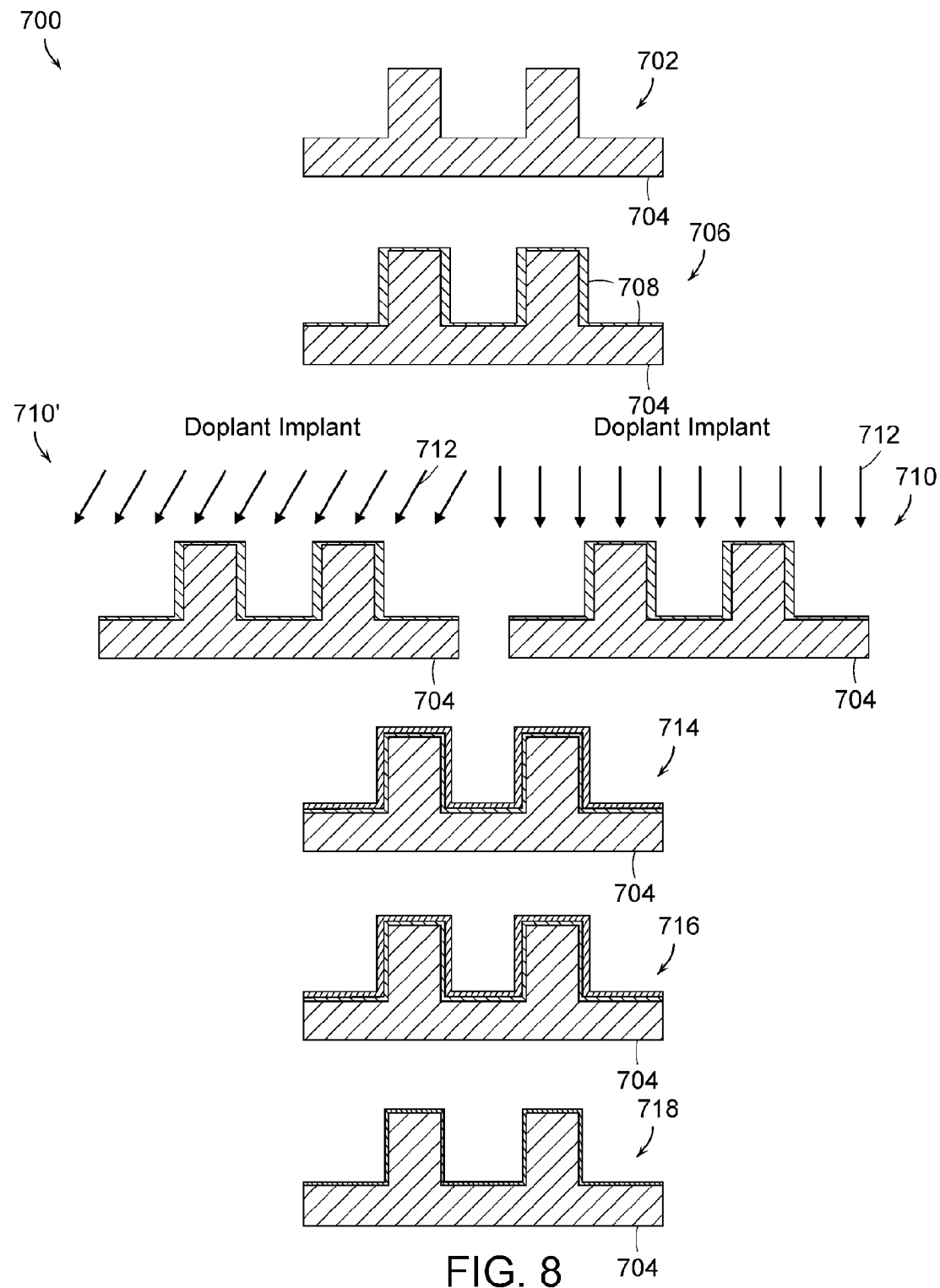
FIG. 8 illustrates a process diagram of a method of combined conformal dopant deposition and dopant ion implantation according to the present invention.

FIG. 8 illustrates a process diagram 700 of a method of combined conformal dopant deposition and dopant ion implantation according to the present invention. In the first step 702, a substrate 704 with both planar and nonplanar features is prepared for deposition of dopant material. The substrate 704 is cleaned to remove impurities before ion implantation. In some embodiments, a blocking layer is deposited on the cleaned substrate 704 as described in connection with FIG. 5. The thickness and composition of the blocking layer are chosen so that dopant ion penetration into the planar features of the substrate 704 is reduced to a desired ion penetration that achieves the desired doping profile in the planar features after annealing.

In the second step 706, a layer of dopant material 708 is anisotropically deposited on the nonplanar and planar features of a substrate 704. The deposition in step 706 is performed so that the thickness of the layer of dopant material 708 on the sides of the nonplanar features on the substrate 704 is significantly greater than the thickness of the layer of dopant material 708 on the planar surfaces of the substrate 704. In many embodiments, the deposition is performed so that the thickness of the layer of dopant material 708 on the planar surfaces of the substrate 704 is minimized. The thickness of the dopant material 708 on the nonplanar surface of the substrate 704 is chosen to achieve the desired doping profile of the nonplanar surfaces of the substrate after annealing.

One skilled in the art will appreciate that the layer of dopant material 708 can be deposited by numerous deposition means known in the art. In some embodiments, the layer of dopant material 708 is deposited using plasma processing. A plasma is generated proximate to the substrate 708 from a volume of feed gas. In some embodiments, the feed gas includes at least one of B2H6, PH3, AsH3, BF3, PF3, PF5, and AsF5. The deposition of the dopant material can be performed in the plasma doping chamber or can be performed in a separate chamber. In some embodiments, the deposition of the dopant material 708 is performed in a chamber of a cluster tool 300, such as the cluster tool 300 that is described in connection with FIG. 3.

In the third step 710, dopant ions 712 are generated and delivered to the substrate 704. In some embodiments, the rate of depositing the layer of dopant material 708 on nonplanar features of the substrate 704 in the second step 706 is controlled relative to the rate of implanting dopant ions in the planar surfaces of the substrate 704 so that a doping profile of the nonplanar features after annealing approximately matches a doping profile of the planar surfaces after annealing.

One skilled in the art will appreciate that the dopant ions 712 can be generated and delivered to the substrate 704 by numerous means known in the art. In some embodiments, the dopant ions 712 are generated and delivered to the substrate 704 using beam-line ion implantation. In other embodiments, the dopant ions 712 are generated and delivered to the substrate 704 using PIII.

In some embodiments, the dopant ions 712 are implanted by applying a bias voltage to at least one of the platen 148 (FIGS. 1 and 2) supporting the substrate 504 and to the grating 154, 202 (FIGS. 1 and 2) positioned proximate to the platen 148. The bias voltage can be pulsed DC, DC or an AC bias voltage. The bias voltage is adjusted to achieve the desired ion energy that will result in the desired doping profile of the planar features of the substrate 704 after annealing.

The third step 710 illustrates the dopant ions 712 being directed at a normal angle to the planar surfaces of the substrate 704. In an alternative embodiment, the third step 710' illustrates the dopant ions 712 being directed at a non-normal angle relative to the planar surfaces of the substrate 704. Extracting the inert ions 712 towards the substrate 704 at a non-normal angle relative to the planar surface of the substrate 704 can be achieved in several ways. For example, the substrate 704 or platen 148 (FIGS. 1 and 2) can be tilted relative to the plasma source 102 (FIGS. 1 and 2). Also, the grating 202 (FIG. 2) can be tilted relative to the plasma source 102 and the platen 148 as shown in FIG. 2.

In the fourth step 714, the substrate 704 with the deposited and implanted dopant material is exposed to an oxidizing plasma comprising reactive neutrals that conformally react with the dopant materials deposited on the nonplanar features of the substrate 704. The oxidizer plasma produces an oxide that renders the dopant material deposited on the nonplanar features of the substrate 704 at least partially inert. The oxidizer plasma can be generated with at least one of oxygen and nitrogen gas. The resulting oxides protect the nonplanar features during later photoresist stripping or other chemical processing.

In the fifth step 716, the photoresist layer or other material layers that are used for masking or patterning the substrate 704 are stripped. The photoresist or other material layers can be stripped with wet chemical or dry etching or a combination of both wet chemical and dry etching.

In a sixth step 718, the substrate 704 is annealed to diffuse dopant material on the nonplanar features of the substrate 704 into the substrate 704 and also to activate the dopant ions implanted into the substrate 704. In some embodiments, the annealing generates a thermal gradient from the top of the nonplanar features to the bottom of the nonplanar features. In some embodiments, rapid thermal annealing is performed. In some embodiments, multi-step annealing, such as multi-step rapid thermal annealing, is performed.

Thus, one method of doping according to the present invention includes generating a first group of dopant ions from a first volume of feed gas. A voltage is applied to at least one of a platen supporting a substrate having planar and nonplanar features and a grating in order to extract the first group of dopant ions through the grating towards the substrate.

A plasma is generated proximate to the substrate from a second volume of feed gas. The plasma deposits dopant material on the nonplanar features of the substrate. An oxidizer plasma comprising reactive neutrals is generated that conformally reacts with the dopant materials deposited on the nonplanar features of the substrate in order to render the dopant material deposited on nonplanar features of the substrate at least partially inert and to protect the nonplanar features during photoresist stripping processing. Photoresist layers are then stripped from the substrate.

The substrate is annealed to diffuse dopant material in the planar and the nonplanar features of the substrate. In some embodiment, the annealing activates the dopant ions implanted into the substrate. Rapid thermal annealing can be used. In addition, multi-step annealing, such as multi-step rapid thermal annealing can be used. In some embodiments, the annealing generates a thermal gradient from a top of the nonplanar features to the bottom of the nonplanar features. In some embodiments, a rate of depositing dopant ions on nonplanar features of the substrate is controlled relative to a rate of implanting dopant ions in the planar surfaces of the substrate so that a doping profile of the nonplanar features after annealing approximately matches a doping profile of the planar surfaces after annealing.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, may be made therein without departing from the spirit and scope of the invention as defined by the appended claims.

What is claimed is:

1. A method of doping comprising:
   depositing a layer of dopant material on nonplanar and planar features of a substrate;
   generating inert ions from an inert feed gas; and
   extracting the inert ions towards the substrate, the inert ions physically knocking the dopant material into both the planar and nonplanar features of the substrate, wherein the inert ions are extracted towards the substrate at a non-normal angle relative to the planar surface of the substrate.

2. The method of claim 1 wherein the inert feed gas comprises at least one of He, Ne, Ar, Kr and Xe.

3. The method of claim 1 wherein the layer of dopant material is deposited using at least one of B2H6, PH3, AsH3, BF3, PF3 and AsF5.

4. The method of claim 1 wherein a mass of the inert ions is chosen to be similar to a mass of the dopant ions.

5. The method of claim 1 wherein the extracting the inert ions comprises applying a bias voltage to at least one of a platen supporting the substrate and a grating positioned proximate to the platen.

6. The method of claim 1 wherein the extracting the inert ions towards the substrate is performed with a beam-line ion implanter.

7. The method of claim 1 wherein the depositing the layer of dopant material on nonplanar features of the substrate and the extracting the inert ions towards the substrate are performed in different chambers.

8. The method of claim 1 further comprising biasing the substrate with at least one of a DC, pulsed DC, and an AC bias while extracting the inert ions towards the substrate.

9. The method of claim 1 wherein at least one of an amplitude, a repetition rate, and a pulse width is chosen to achieve a desired doping profile of the planar and nonplanar features of the substrate after annealing.

10. The method of claim 1 wherein a thickness of the deposited layer on the planar features is in a range that is between 1-100 times the thickness of the deposited layer on the nonplanar features.

11. The method of claim 1 wherein at least one of a thickness of the layer of dopant material, a density of inert ions generated, a pressure proximate to the substrate, and a voltage applied to at least one of the platen supporting the substrate and a grating is chosen so that the doping profile of the nonplanar features approximately matches a doping profile of planar surfaces.

12. A method of doping comprising:
    depositing a layer of dopant material on nonplanar and planar features of a substrate;
    generating inert ions from an inert feed gas; and
    extracting the inert ions towards the substrate, the inert ions physically knocking the dopant material into both the planar and nonplanar features of the substrate, wherein at least one of a thickness of the layer of dopant material, a density of inert ions generated, a pressure proximate to the substrate, and a voltage applied to at least one of the platen supporting the substrate and a grating is chosen so that the doping profile of the nonplanar features approximately matches a doping profile of planar surfaces.

13. The method of claim 12 wherein the inert feed gas comprises at least one of He, Ne, Ar, Kr and Xe.

14. The method of claim 12 wherein the layer of dopant material is deposited using at least one of $B_2H_6$, $PH_3$, $AsH_3$, $BF_3$, $PF_3$ and $AsF_5$.

15. The method of claim 12 wherein a mass of the inert ions is chosen to be similar to a mass of the dopant ions.

16. The method of claim 12 wherein the extracting the inert ions comprises applying a bias voltage to at least one of a platen supporting the substrate and a grating positioned proximate to the platen.

17. The method of claim 12 wherein the extracting the inert ions towards the substrate is performed with a beam-line ion implanter.

18. The method of claim 12 wherein the depositing the layer of dopant material on nonplanar features of the substrate and the extracting the inert ions towards the substrate are performed in different chambers.

19. The method of claim 12 further comprising biasing the substrate with at least one of a DC, pulsed DC, and an AC bias while extracting the inert ions towards the substrate.

20. The method of claim 12 wherein at least one of an amplitude, a repetition rate, and a pulse width is chosen to achieve a desired doping profile of the planar and nonplanar features of the substrate after annealing.

21. The method of claim 13 wherein a thickness of the deposited layer on the planar features is in a range that is between 1-100 times the thickness of the deposited layer on the nonplanar features.

\* \* \* \* \*